United States Patent [19]

Hofer et al.

[11] 4,291,272

[45] Sep. 22, 1981

[54] METHOD FOR REDUCING HOMONUCLEAR BROADENING IN MAGNETIC RESONANCE SPECTRA OF SOLIDS

[75] Inventors: Donald C. Hofer, Hopewell Junction, N.Y.; Raymond D. Kendrick, San Jose; Costantino S. Yannoni, Los Gatos, both of Calif.

[73] Assignee: International Business Machines Corporation, Armonk, N.Y.

[21] Appl. No.: 108,254

[22] Filed: Dec. 28, 1979

[51] Int. Cl.³ ............................................. G01N 27/00
[52] U.S. Cl. .................................... 324/313; 324/304
[58] Field of Search ................ 324/300, 304, 315, 313

[56] References Cited

U.S. PATENT DOCUMENTS

| | | | |
|---|---|---|---|
| 3,474,329 | 10/1969 | Waugh | 324/300 |
| 3,530,374 | 9/1970 | Haeberlen et al. | 324/304 |
| 3,795,856 | 3/1974 | Keller | 324/313 |
| 3,968,423 | 7/1976 | Hoshino | 324/313 |

OTHER PUBLICATIONS

M. L. Lee et al., "Nuclear-Magnetic-Resonance Line Narrowing by a Rotating rf Field", *Phys. Rev.*, vol. 140, No. A4, (1965), pp. 1261–1271.

C. Yannoni et al., "A New Coherent Averaging Effect in Magnetic Resonance Modulation-Induced Reduction of Dipolar Coupling", *Phys. Rev. Letters*, vol. 37, (1976), pp. 1230–1232.

Ellett et al., "Advances in Magnetic Resonance", vol. 5, J. S. Waugh, Academic Press, N.Y. (1971), p. 117–176 (Particular reference to "phase glitches" are on page 170 and are set forth in Section D3, pp. 142–147).

J. S. Waugh et al., *Phys. Rev. Letters*, vol. 20, No. 5, pp. 180–182 (1968).

*Primary Examiner*—Michael J. Tokar
*Attorney, Agent, or Firm*—Michael J. Weins

[57] ABSTRACT

A method for line narrowing in nuclear magnetic resonance (NMR) studies in solids is described. The method employs quasi-continuous amplitude modulation of an rf field wherein the field is eliminated at intervals for short periods of time at or about the time when the amplitude for both the maximum and minimum approach zero, these intervals creating windows where the NMR signal can be observed.

6 Claims, 16 Drawing Figures

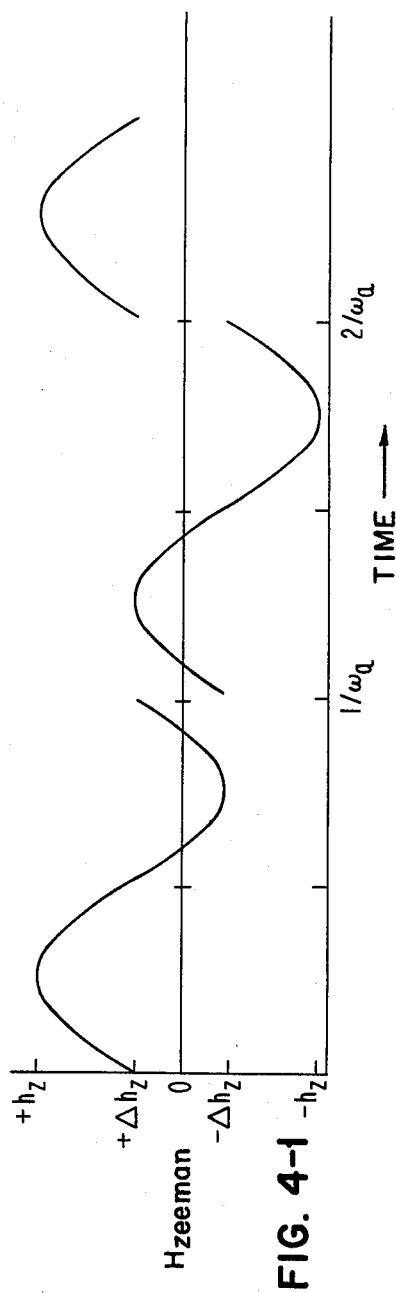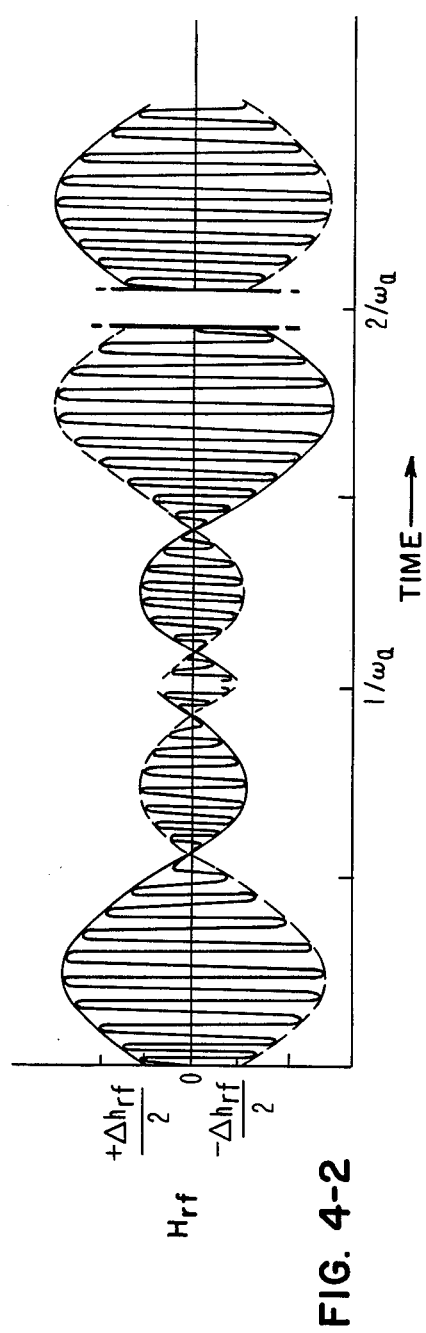

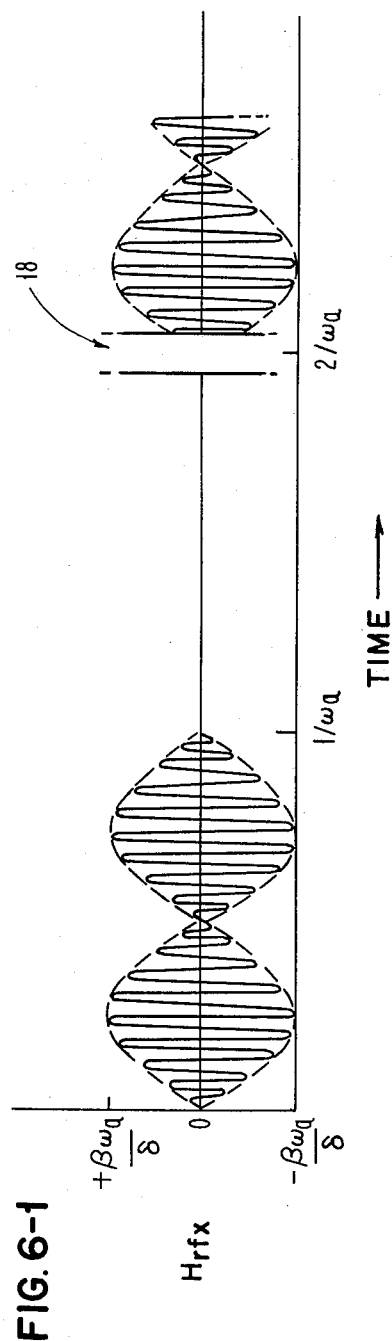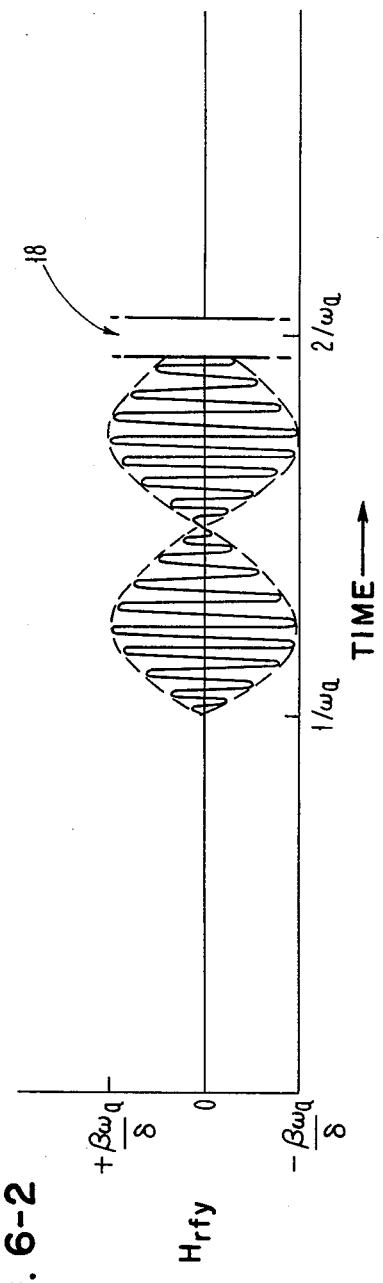
FIG. 6-1
FIG. 6-2

| FIG. 8-1 | FIG. 8-2 |

METHOD FOR REDUCING HOMONUCLEAR BROADENING IN MAGNETIC RESONANCE SPECTRA OF SOLIDS

DESCRIPTION

1. Technical Field

This invention relates to a method for generating nuclear magnetic resonance spectra in solids, and pertains more particularly to employing one or more quasi-continuous sinusoidally modulated rf fields which enhance resolution of the resultant spectrum.

2. Background Art

There has been a long period of development of high resolution techniques for the study of nuclear magnetic resonance spectra in solids. One of the early techniques was that of Lee and Goldberg published in an article entitled "Nuclear-Magnetic-Resonance Line Narrowing by a Rotating rf Field", Phys. Rev., Vol. 140, No. A4, p. 1261-71 (1965). This technique employed a continuously off-resonance Zeeman field in conjunction with a continuous rf field. The combined fields produced line narrowing; however, in order to generate a high resolution NMR line spectrum it was necessary to systematically repeat the experiment under various operating conditions.

Waugh and his co-workers were the first to appreciate that single pass techniques could be employed that would generate a response in the solid and a spectrometer signal that, upon Fourier Tranformation, would yield a high resolution NMR spectrum. This work resulted in three patents. In U.S. Pat. No. 3,474,329 the use of a constant Zeeman field with either a pulsed rf field or a series of rf pulse cycles with amplitude and phase modulation was proposed. While the pulsed rf field effectively reduces line broadening, it was difficult to regulate the pulse cycle with sufficient accuracy to assure extensive line narrowing. While the continuous amplitude modulation of the rf field would appear more attractive for regulation, the schemes disclosed in U.S. Pat. No. 3,474,329 did not produce the desired line narrowing. In the subsequent U.S. Pat. Nos. 3,530,373 and 3,530,374 additional rf pulse patterns were disclosed, as well as pulse modulation of the Zeeman field. While the pulse techniques disclosed and claimed by these latter U.S. Pat. Nos., 3,530,373 and 3,530,374, produced a superior NMR spectrum to those of U.S. Pat. No. 3,474,329 the line narrowing required more complex pulse sequences and further increased the difficulty in generation of the pulse sequences.

Yannoni et al in an article entitled "A New Coherent Averaging Effect in Magnetic Resonance: Modulation-Induced Reduction of Dipolar Coupling", Phys. Rev. Letters, Vol. 37, pp. 1230-1232 (1976) discloses that one can obtain line narrowing in NMR experiments by the use of either a continuous Zeeman field and pulses of frequency modulated rf, or an amplitude modulated Zeeman field with a semi-continuous rf field into which windows are introduced by elimination of the rf field. While the control required to produce these field sequences are simpler than those of Waugh et al described in U.S. Pat. Nos. 3,474,329; 3,530,373; and 3,530,374, the information content of the resulting spectrum is less complete.

BRIEF DESCRIPTION OF THE DRAWINGS

FIGS. 2-1, 2-2 and 2-3 are schematic representations of a sinusoidal variation of the off-resonance component of the Zeeman field and two associated quasi-continuous amplitude modulated rf fields which are normal to the off-resonance component of the Zeeman field. These fields are used to practice a second mode of the invention.

FIGS. 3-1 and 3-2 are schematic representations of the waveforms of FIGS. 1-1 and 1-2 which have been shifted by a $\Delta\,h_z$ and $\Delta\,h_{rf}$. These shifted fields are used to practice a third mode of the invention.

FIGS. 4-1 and 4-2 are schematic representations of the waveforms of FIGS. 1-1 and 1-2 which have been shifted by a second scheme. This shifting procedure is employed to practice a fourth mode of the invention.

FIGS. 6-1 and 6-2 are schematic representations of two quasi-continuous amplitude modulated waveforms used to practice a sixth mode of the invention.

FIGS. 8-1 and 8-2 represent a block diagram of an rf unit suitable for providing the waveforms required for the present invention.

DISCLOSURE OF INVENTION

A method for narrowing the lines associated with the spectrum generated by nuclear magnetic resonance in solids is described. This method employs quasi-continuous sinusoidal modulation of a first rf field, and at least a second modulating field which is in one of the two directions orthogonal to the first rf field. The first field is along an axis orthogonal with respect to a z axis, where the z axis is in the direction of the Zeeman field.

When the second modulating field is a continuous sinusoidally modulated component of the Zeeman field, the amplitude modulation of the rf field is adjusted so that the envelope of the modulation is sinusoidal and has the same period as the modulation of the Zeeman field. Discontinuities in the rf field result from eliminating the field for periods of about 2 to 5 microseconds at or about the zero crossing of the modulation envelope. These intervals where the rf field is eliminated are employed as observation windows for the NMR signal. Alternatively, a virtual sinusoidal variation of the Zeeman field may be employed. The virtual field may be induced by imposing a frequency modulation of the rf field. The frequency modulation is adjusted so that the virtual amplitude modulation is sinusoidal, having a period equal to the period of amplitude modulation of the rf field.

When the second modulating field is an rf field orthogonal in the rotating frame, i.e., 90° out of phase relative to the first rf field, the amplitude of modulation is adjusted so that the second modulating rf field has an envelope which matches the first rf field envelope. The two rf fields are alternately applied in a periodic manner.

BEST MODES FOR CARRYING OUT THE INVENTION

Figure 1:
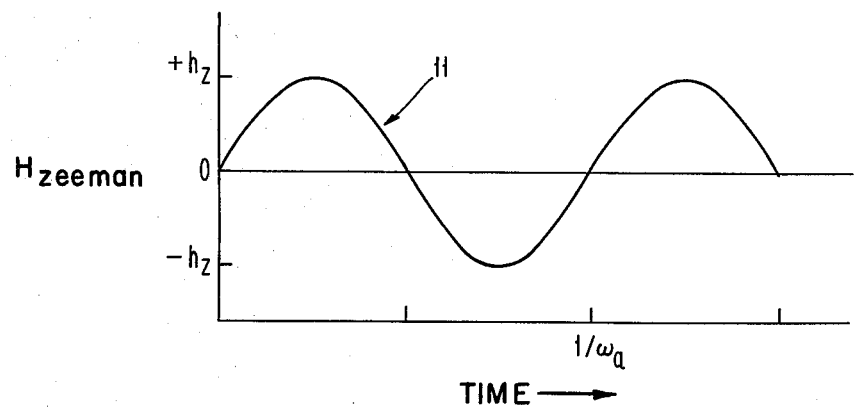
FIGS. 1-1 and 1-2 are schematic representations of a sinusoidal variation of the off-resonance component of the Zeeman field and a quasi-continuous amplitude modulated rf field normal to the off-resonance component of the Zeeman field used to practice the invention.
Figures 1, 2:
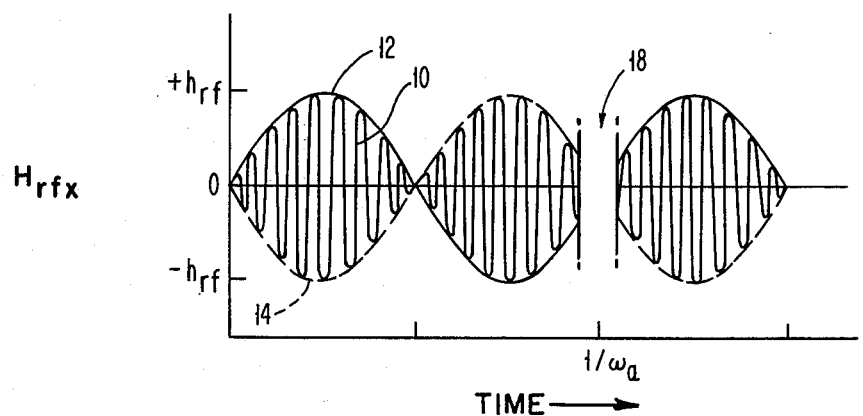

FIGS. 1-1 and 1-2 illustrate a first mode where the field modulations associated with one technique for line narrowing are relatively easy to execute. The experiment is conducted by employing a quasi-continuous sinusoidally modulated rf field in a direction which is orthogonal to the direction of the Zeeman field. This waveform is illustrated in FIG. 1-2. A second orthogonal field is audio-modulated and applied along the z axis in the direction of the Zeeman field. This field includes a continuous modulation of the off-resonance Zeeman component 11, which is illustrated in FIG. 1-1. The first quasi-continuous sinusoidally modulated rf field 10 is enveloped by two sinusoidal curves, 12 and 14, 180° out of phase, each of which has a period of length $1/\omega_a$, which is the same period as is employed for the sinusoidal oscillating off-resonance Zeeman field 11. Discontinuities in the rf field result from eliminating the field for intervals 18 of about 2 to 5 microseconds at or about the zero crossing of the modulated envelope formed by the sinusoidal curves 12 and 14. These intervals 18 where the rf field is eliminated are employed as windows for viewing the NMR signal. The successful operation of this experiment is dependent upon the relative magnitude of the waveforms 11, 12 and 14. When the magnitude of the perturbed component of the Zeeman field 11 can be represented by $$H_{1z} = \frac{1}{\sqrt{3}} \beta \frac{\omega_a}{\gamma} \cos \omega_a t$$

where:

$H_{1z}$ = magnitude of the modulated Zeeman field
$\beta$ = constant
$\omega_a$ = constant, the magnitude of which is large with respect to the width of an NMR line of the solid under study.
$\gamma$ = gyromagnetic ratio of the nuclei then, the magnitude of the rf field 10 should be given by $$H_{1x} = \frac{\sqrt{2}}{\sqrt{3}} \beta \frac{\omega_a}{\gamma} \cos \omega_a t$$

where:

$H_{1x}$ = magnitude of the modulated quasi-continuous rf field

It can be seen that $H_{1z}$ and $H_{1x}$ are in the ratio of $1:\sqrt{2}$, the factor of $1/\sqrt{3}$ being employed in both cases as a normalizing function. If the above mentioned waveforms are employed, then line narrowing will occur when the argument $\beta$ is selected so as to give the zero order Bessel function a value of zero, $J_0(2\beta) = -2J_0(\beta) \approx 0$.

Figures 1, 2:
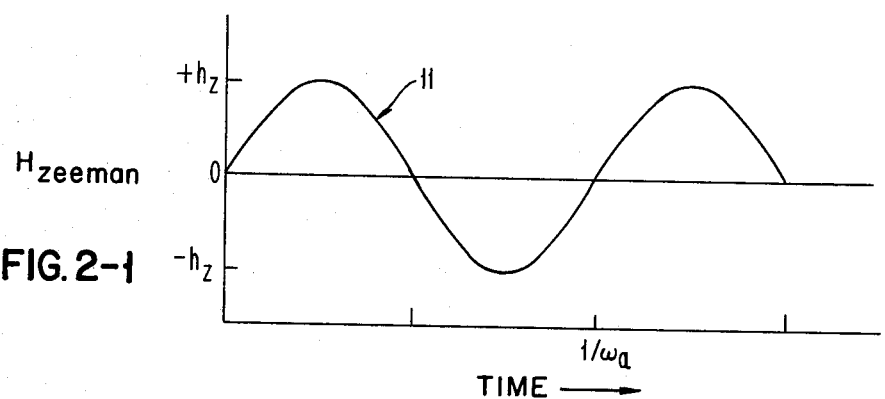
Figure 2:
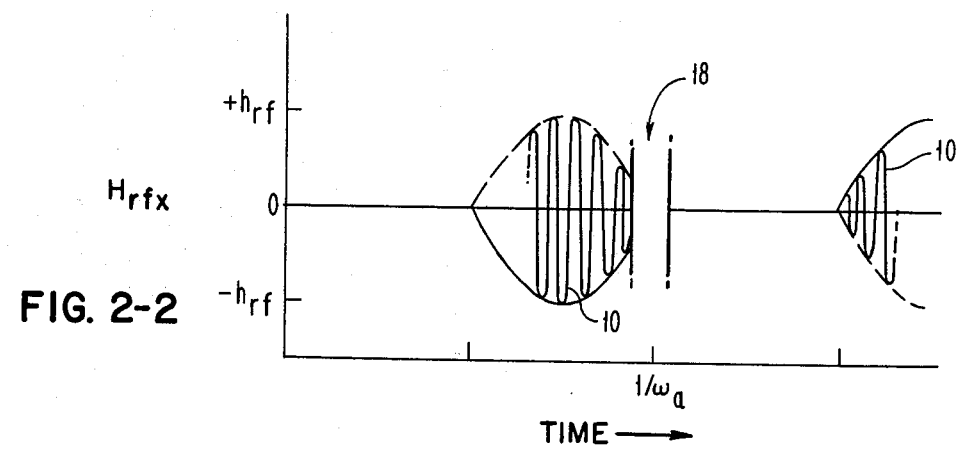
Figures 2, 3:
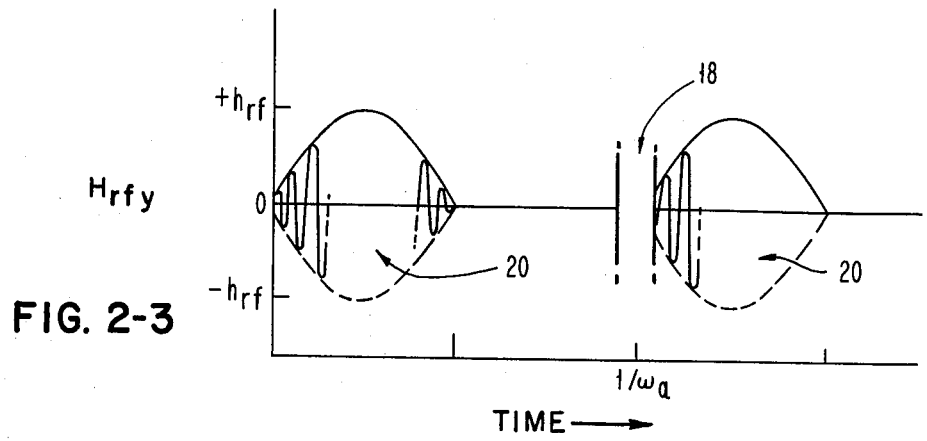
Figures 1, 3:
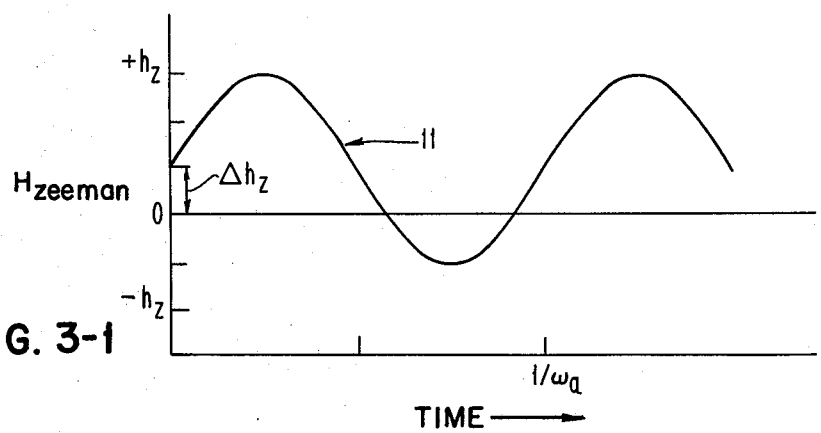
Figures 2, 3:
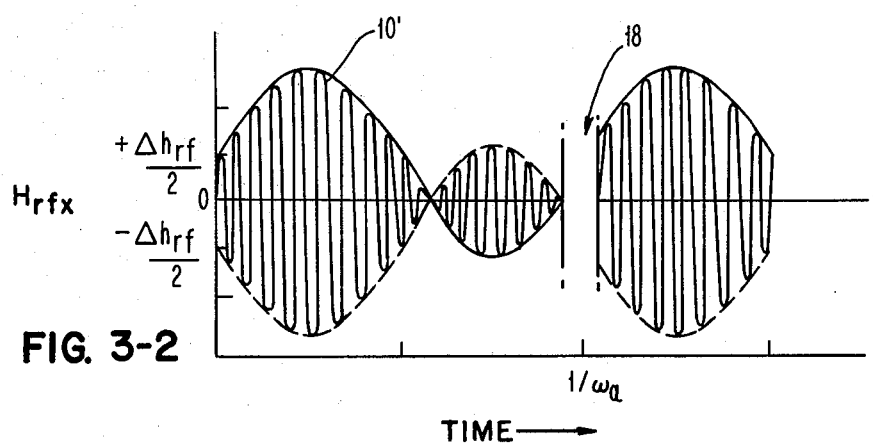

FIGS. 2-1, 2-2 and 2-3 represent a second mode; in this embodiment of the present invention, three modulated fields are employed. In this case a second rf field 20 is applied orthogonal to the first rf field 10 and the off resonant component 11 of the Zeeman field. The waveforms are depicted in FIGS. 2-1, 2-2 and 2-3. Analytically, these waveforms may be described as $$H_{1z} = \frac{1}{\sqrt{3}} \beta \frac{\omega_a}{\gamma} \cos \omega_a t$$

$$H_{1x} = \left[ \frac{\sqrt{2}}{\sqrt{3}} \beta \frac{\omega_a}{\gamma} \cos \omega_a t \right] \delta(0, \tfrac{1}{2}\omega_a)$$

$$H_{1y} = \left[ \frac{\sqrt{2}}{\sqrt{3}} \beta \frac{\omega_a}{\gamma} \cos \omega_a t \right] \delta(\tfrac{1}{2}\omega_a, 1/\omega_a)$$

The first two equations defining $H_{1z}$ and $H_{1x}$ are identical to the equations for the first mode, with the exception that the $H_{1x}$ is modified by a $\delta$ function which makes this waveform operable only during the alternate half periods. The $H_{1y}$ waveform is the same as $H_{1x}$ with the exception of a complementary $\delta$ function; thus the net effect of applying an $H_{1x}$ and $H_{1y}$ is to generate two modulated rf fields for alternate half cycles. Again the length of the averaging cycle is one audio modulation period, $1/\omega_a$. Observation windows 18 are introduced by eliminating the first rf field 10 and the second rf field 20 for intervals of time of from about 2 to 5 microseconds at periodic intervals on or about what would be the zero crossing of the two modulating envelopes had they been continuous wave functions. These windows are introduced at integral numbers of $1/\omega_a$. The conditions for successful operation of this experiment are somewhat simpler than the conditions for the operation of the experiment as set forth in FIGS. 1-1 and 1-2. In this case, only one Bessel function must be satisfied, $J_0(2\beta) \approx 0$. Hence, there has been a relaxation of the additional requirement set forth in the first mode that $-2 J_0(\beta) \approx 0$.

Other experiments may be defined where the off-resonance Zeeman field has two components, the first is as illustrated in modes 1 and 2, and the second is an additional bias field commonly referred to as a DC bias field, applied to the Zeeman field, as well as to the rf field. For this third mode, the Zeeman field of the first mode would be modified so the form would include a term not a function of t, the analytical representation of the waveform would be:

$$H_{1z} = \frac{1}{2\sqrt{3}} \frac{\omega_a}{\gamma} + \frac{1}{\sqrt{3}} \beta \frac{\omega_a}{\gamma} \cos \omega_a t$$

Likewise, the formulation for the rf field must be modified as follows:

$$H_{1x} = \frac{1}{\sqrt{6}} \frac{\omega_a}{\gamma} + \frac{\sqrt{2}}{\sqrt{3}} \beta \frac{\omega_a}{\gamma} \cos \omega_a t$$

Again, the ratio between the amplitudes of $H_{1z}$ and $H_{1x}$ remains $1:\sqrt{2}$. As in the case of modes 1 and 2, averaging will be over one audio modulation period. In this case the averaging condition results in the Bessel functions being related as follows:

$J_0(\beta) = J_1(2\beta) \approx 0$. This condition is somewhat simpler and is mathematically less restrictive than the condition described in mode 1. The advantage of this experiment is that a less stringent mathematical criterion is employed and the technique eliminates higher order terms in the averaging process and therefore should be more effective in line narrowing than the method of mode 1.

Pictorially, the waveforms for mode 3 are illustrated in FIGS. 3-1 and 3-2. FIG. 3-1 shows the Zeeman field 11 which is identical to the Zeeman field 11 of mode 1 with the exception that the average value is displaced at $\Delta h_z$. FIG. 3-2 illustrates the waveforms for the rf field 10'. Again, the envelope is sinusoidal having the same amplitude and frequency as the envelope in mode 1. However, the upper branch of the envelope and lower branch of the envelope no longer meet at the same point in time as in mode 1. In addition they are separated by a $\Delta h_{rf}$ at intervals of $\frac{1}{2}\omega_a$, $1/\omega_a$ and every subsequent half cycle of the modulation.

Another effective method of constructing sinusoidal modulated NMR experients is to vary the experiment of mode 3. This 4th mode is depicted in FIGS. 4-1 and 4-2, and simply involves changing the sign of the bias of the perturbing magnetic fields.

For example, the z field would have a DC bias $\Delta h_z$ for the first half cycle and for the second half cycle would have a $-\Delta h_z$ bias. Alternating the sign of the DC component further simplifies the mathematical criterion for successful averaging and results in a less stringent mathematical criterion. The criterion is: $J_1(2\beta)=0$ and the condition $J_0(\beta)=0$ of mode 3 has vanished. The conditions of mode 4 produce the sharpest NMR lines and this mode is superior to the preceding examples. However, this improvement is accomplished at the cost of increased complexity.

It is possible to perform the experiments described in modes 1, 2, 3 and 4 employing virtual variations of the Zeeman field. The virtual variations are introduced by frequency modulating the rf field. The frequency modulation (FM) of the rf field is described by $$\omega_{rf} = \omega_0 + \frac{1}{\sqrt{3}} \beta \, \omega_a \cos \omega_a t.$$

Particularly noteworthy is the fact that the rf frequency sinusoidally varies about the resonant frequencies of the sample. The frequency modulation has the same $\cos \omega_a t$ term with the same modulating coefficient $\beta$. Likewise, the conditions for successfully averaging, using frequency modulation of the rf field, are identical to those conditions on the Bessel functions set forth in modes 1, 2, 3 and 4. For the purpose of illustration, if we consider the case of the first mode where the sinusoidally modulated Zeeman field and rf fields are used, the amplitude modulation of the two fields would be given by $$H_{1x} = \frac{\sqrt{2}}{\sqrt{3}} \beta \frac{\omega_a}{\gamma} \cos \omega_a t$$

$$H_{1z} = \frac{1}{\sqrt{3}} \beta \frac{\omega_a}{\gamma} \cos \omega_a t$$

The FM version of this experiment would have only one real field $H_{1x}$. The $H_{1z}$ would be virtually created by the FM of $H_{1x}$ rf. In this case no explicit modulated Zeeman field is applied.

The frequency modulation of the rf field is given by $$\omega_{rf} = \omega_0 + \frac{1}{\sqrt{3}} \beta \, \omega_a \cos \omega_a t$$

where the value of $\beta$ is such that the zero order Bessel functions have the following relationship:

$$J_0(2\beta) = -2J_0(\beta) \approx 0.$$

Figure 5:
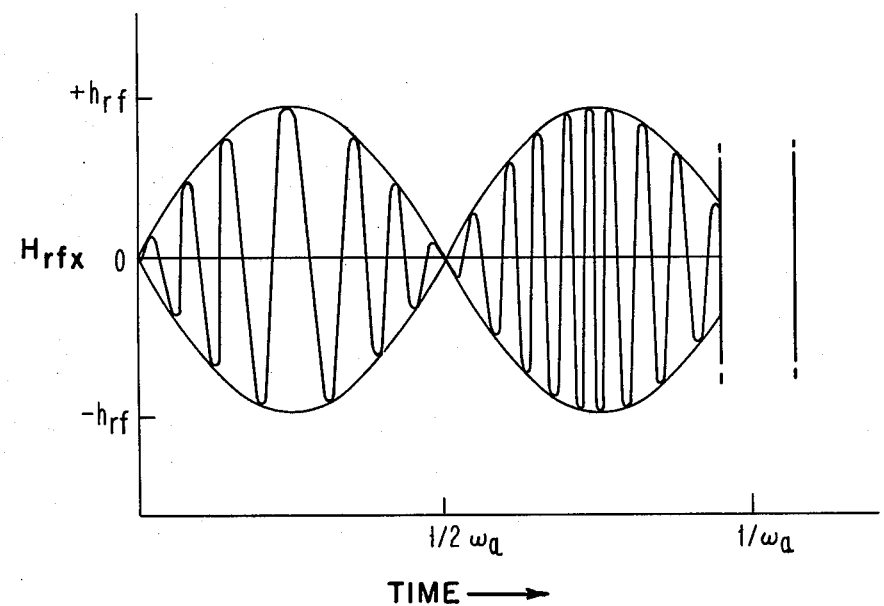
FIG. 5 is a schematic representation of the frequency modulation of an rf field that will produce a virtual modulation of the Zeeman field and is employed to practice a fifth mode of the invention.

This wave function is pictorially represented in FIG. 5.

All examples to date have dealt with a quasi-continuous sinusoidal modulation of the first rf field with the second modulated field being the sinusoidal component of a Zeeman field, either real or virtual. It is also possible to practice the invention by employing a second field which is an rf field orthogonal to the first rf field. The second rf field is modulated in an analogous manner to the first rf field. The two rf fields are applied in alternate half periods. This could be mathematically expressed as follows:

$$H_{1x} = [\beta(\omega_a/\gamma) \cos \omega_a t]\delta(0, \tfrac{1}{2}\omega_a)$$

$$H_{1y} = [\beta(\omega_a/\gamma) \cos \omega_a t]\delta(\tfrac{1}{2}\omega_a, 1/\omega_a)$$

In this case the value of $\beta$ is selected such that:

$$J_0(2\beta) = -1/6$$

This method is analogous to the Waugh multipulse experiments but does not suffer from the degrading effects of rf pulse rise and fall phase glitches as described by Ellett et al in Advances in Magnetic Resonance, Vol. 5, J. S. Waugh, Academic Press, N.Y. pp/117-176, (1971). Phase glitches arise from sharp cutoff (or on) of the rf pulse. However, the amplitude of the phase glitch increases as the amplitude of the rf field at the time of cutoff (or on). Since the amplitude in the modulated rf experiments described herein is small when cutoff (or on) occurs, the phase glitch problem is correspondingly less.

The waveforms for the above example are given in FIGS. 6-1 and 6-2.

In all the aforementioned NMR experiments it must be kept in mind that bounds on the value of $\omega_a$ do exist. These bounds originate from the NMR relaxation physics inherent in these experiments. The argument is essentially that the "dipolar averaging" must take place in a time less than $T_2$, the spin-spin relaxation time. For a rigid lattice solid such as $CaF_2$ (the classical test sample for high resolution solid NMR experiments) $T_2 \sim 20$ μsec. Here $\omega_a$ must be $>50$ KHz, but as a rule "subcycle averaging" relaxes this requirement so that $\omega_a$ has bounds 50 KHz$>\omega_a>$15 KHz.

Subcycle averaging is further defined in J. S. Waugh et al, *Phys. Rev. Lett.*, Vol. 20, No. 5, p. 180-182 (1968). This means that typical values of the perturbing fields $H_{1z}$, $H_{rfx}$, and $H_{rfy}$ will be 20 to 60 gauss. All that is essential for successful implementation of the experiments is to adhere to the bounds and field ratios described earlier.

Figure 7:
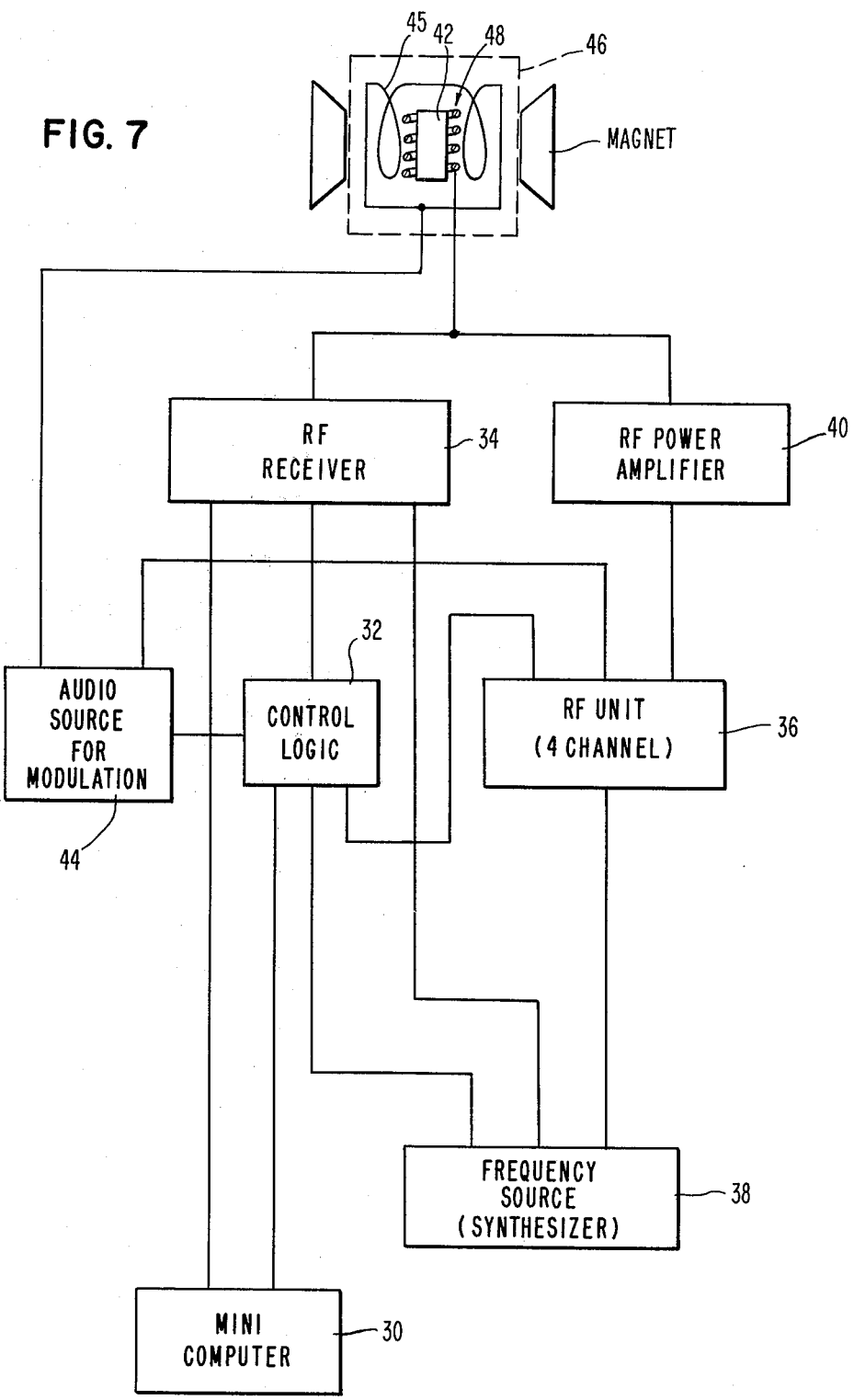
FIG. 7 is an electronic block diagram illustrating a system which is connected to a probe for implementing the invention.

FIG. 7 is an electronic block diagram illustrating a system for carrying the invention into practice. Minicomputer 30 is tied to a logic control device 32 and to the rf receiver 34. The logic control determines the activation of an rf unit 36 having four channels and a frequency source 38 that can be modulated. The source 38 and the rf unit 36 drive the rf power amplifier 40 which in turn generates a signal for interaction with the sample 42. The response from the sample is monitored by the rf receiver 34. It should be noted that the above diagram is similar to other coherent averaging NMR spectrometers. One important difference, however, is that this diagram has an audio source 44 which is controlled by the logic of the system, and is synchronized with the observation window. The audio source has a frequency which is determined by the control logic 32 and the audio waveforms from this source modulate the Zeeman field at the probe through the use of a set of Zeeman field coils 45 in the probe 46. These Zeeman field coils 45 are employed in addition to an rf coil 48 which is used to excite the solid. The audio source is also the sinusoidal modulation source for the rf unit which supplies to the sample in the probe, via the rf power amplifier 40, the modulated rf fields used to implement the experiments in this invention. In experiments where FM is used, the frequency source 38 must be capable of FM modulation. In the absence of conducting experiments which use FM but, for example, modulate the Zeeman field, the experiment would not require the frequency source that can be modulated and it would be possible to substitute a simple crystal oscillator.

Figures 1, 8:
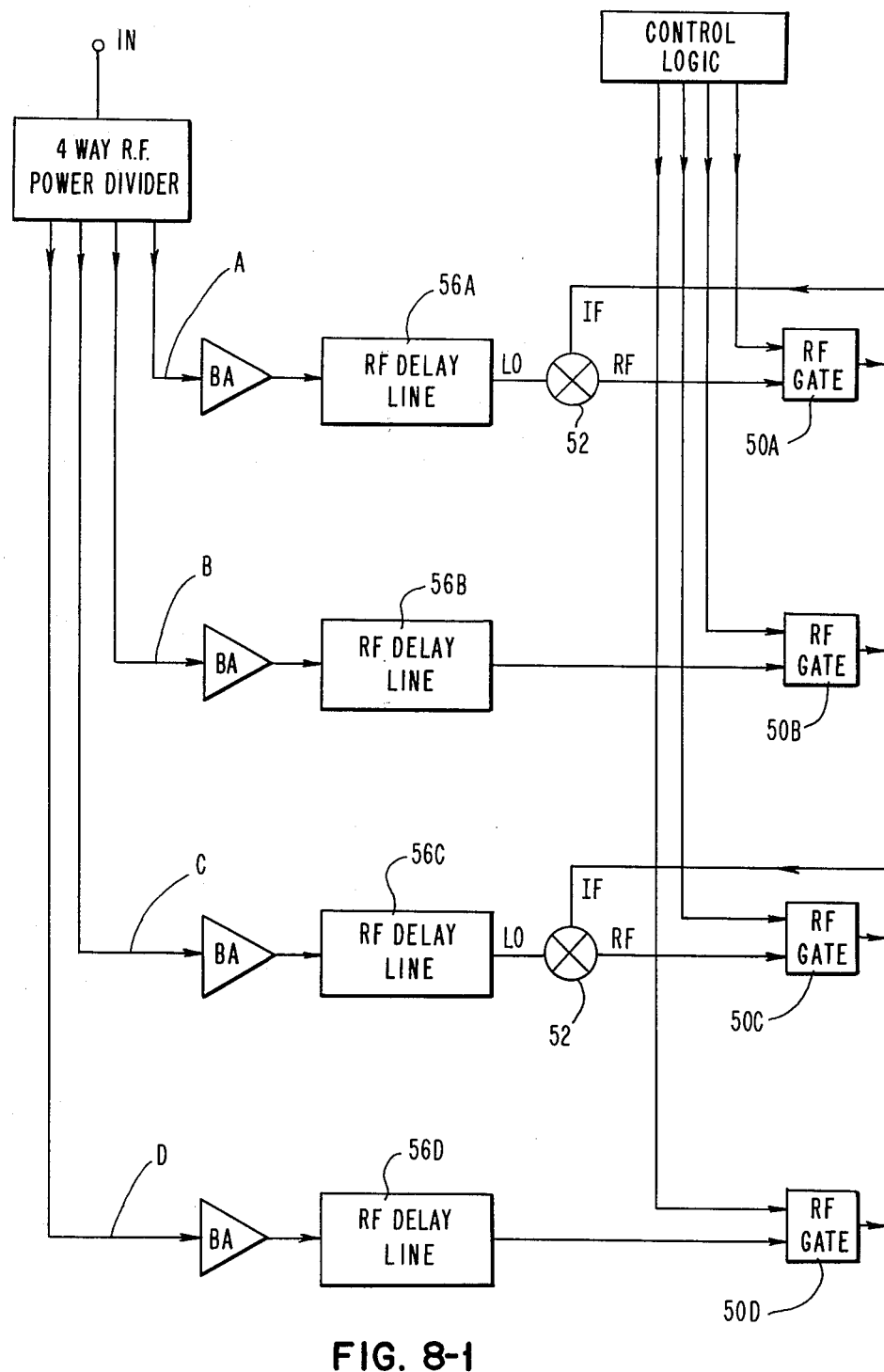
Figures 2, 8:
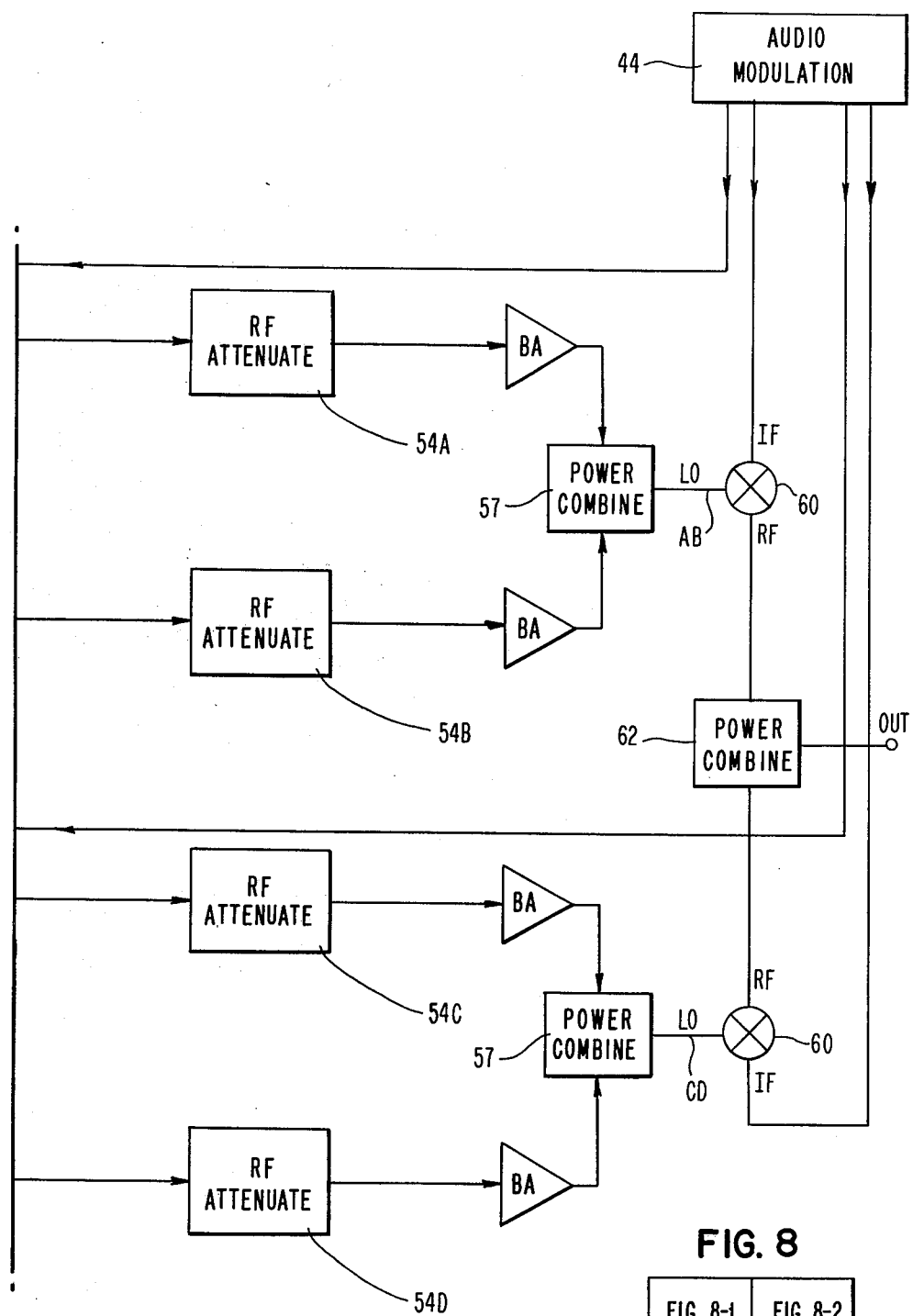

FIGS. 8-1 and 8-2 are block diagram schematics of the rf unit useable in the experiments of this invention herein described. This rf unit is basically a typical four channel rf unit having on/off gates 50 on each of the channels. The gates make it possible to independently turn each channel A, B, C, and D on or off. The four channels are required for the implementation of the most complex experiment shown in FIGS. 4-1 and 4-2. Generally, this four channel unit can be considered to have two subchannels comprised of channels AB and CD respectively. For the experiment in FIGS. 4-1 and 4-2, the rf at the sample originates in alternate audio cycles, $\omega_a$, from subchannel AB and CD. This mode of operation is required because the rf field at the sample has fixed and sinusoidal modulated components. In order to switch between + and − fixed components of field (for FIG. 4-2) the output of subchannels AB and CD are biased $+\frac{1}{2}\Delta \, h_{rf}$ and $-\frac{1}{2}\Delta \, h_{rf}$.

Note that the double balanced mixers 52 must be placed in the unit so that sinusoidally modulated rf waveforms can be generated. The attenuators 54A, 54B, 54C, and 54D which are respectively in each of the channels are more important than in typical high resolution spectrometers. This is because adjustment of the rf field amplitudes is essential to correct values.

The rf delay lines 56A, 56B, 56C, and 56D are incorporated in each of the channels in order to adjust the phase of the rf from these channels. In the example of FIGS. 2-2 and 2-3, rf fields orthogonal to each other are used; these delay lines permit adjustment of this condition. Other units in this diagram termed BA are buffer amplifiers used to gain complete electronic isolation of the channels from each other so that adjustments of phase and attenuation are independent between channels. The channels A and B are combined at 57 to form the subchannel AB; similarily for channels C and D at 58. These subchannels are independently gated by the double balanced mixers 60 for the operation previously described. Finally, the gated outputs of subchannels AB and CD are power combined at 62. With this unit it is possible to conduct experiments ranging from the case where one has only one sinusoidally modulated rf envelope to the case where one has two sinusoidal modulated envelopes plus a DC bias field included on each. In all other ways, this rf unit is identical to that used in traditional NMR experiments.

In general it is true that a multipulse NMR experiment only functions as well as the spectrometer is adjusted. The adjustment of the rf fields for the previously described experiments may be accomplished in a simple and precise manner with a flexibility not normally found in multipulse NMR. The principles governing this setup procedure are similar to those used in "multipulse NMR experiments" except that the forced precession during the $\frac{1}{2}$ period of field modulation is adjusted instead of the adjustment of a pulse.

Consider as an example the following:

We wish to adjust the rf field $H_{1x}$ to have the following amplitude:

$$H_{1x} = K(\omega_a/\gamma)$$

where K is a proportionality constant, $$\frac{\sqrt{2}}{\sqrt{3}} \beta,$$

and $\beta$ is the modulation coefficient defined earlier. In the case of the simple experiment where two modulated fields $H_{1x}$ and $H_{1z}$ are employed the value of $\beta$ we want is 1.2 (i.e., $J_0(2\beta) = J_0(2.4) \approx 0$) so K = 0.979.

This relation requires that the spins precess 0.979 radians during a time equal to one-half of the modulation period $\tau = 2\pi/\omega_a$. Since it is much easier to adjust for a forced precession of $\pi/2$ radians, the adjustment can be made for precisely a $\pi/2$ radian precession, but at another audio frequency $\omega_a'$. Thus:

$$0.979\omega_a = (\pi/2)\omega_a' \qquad (1)$$

$$\omega_a' = (2/\pi)(0.979\omega_a)$$

$$\omega_a' = 0.623\omega_a \qquad (2)$$

Equations 1 and 2 tell us two things:

(1) We must shift to a setup audio modulation frequency $$\omega_a' = 0.623\omega_a$$

for the adjustment.

(2) Setting up at $\omega_a'$ for an rf field amplitude which generates a $\pi/2$ forced precession of the spins in $\frac{1}{2}$ cycle of $\omega_a'$ will produce the required field setting. In fact a large number of $\frac{1}{2}$ cycles, $\omega_a$, of the rf field may be applied to generate a long forced precession as in multipulse NMR experiments where a train of setup pulses would be used. The formula which defines the transverse spin magnetization (i.e., observed transverse spin NMR signal) is $$I_{x,y} = \cos v(n) I_{x,y}(0)$$

$$v(n) = (\pi/2)((-1)^n - 1).$$

In this example n refers to the nth half cycle of audio modulation.

Figure 9:
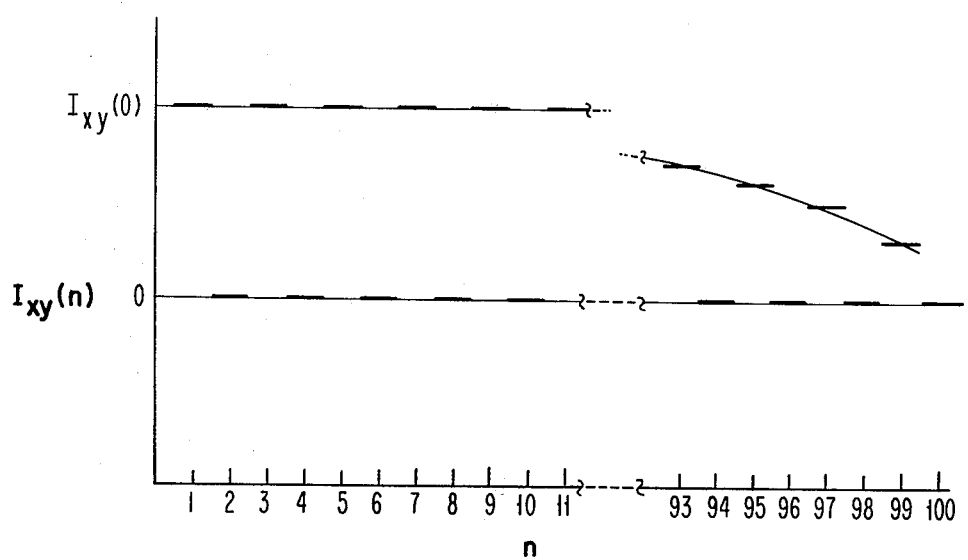
FIG. 9 is a schematic representation of the NMR signal from a tuned system.

To execute this setup procedure one need only adjust the attenuator, 54, FIGS. 8-1 and 8-2, of the rf unit channel A, while the NMR signal from the receiver 34 in FIG. 7, is observed. When the correct setting is reached, the NMR signal from the receiver would look like FIG. 9.

If 100 half cycles of audio modulation are used, adjustment to an accuracy of 0.5% should be easily obtained.

Next, a similar procedure can be used for the $H_{1z}$ adjustment. This case is different in that the Zeeman field is modulated while the rf field is off. A single prepulse of rf would be used from channel B of FIG. 8-1, to generate transverse magnetization. This is followed by a train of Zeeman field modulation half cycles which can be adjusted by changing the power from audio source, 44, FIG. 7, to obtain the signal of FIG. 9.

Finally, one reverts back to the operating frequency $\omega_a$ to achieve the correct fields for a successful experiment.

INDUSTRIAL APPLICABILITY

The present invention will be of use in the testing industry and in particular in non-destructive testing.

It will also be useful to supplement other techniques which probe the structure of solids.

While the present invention has been illustrated and described in terms of preferred modes, it is to be understood that these modes are by way of illustration and not limitation and the right is reserved to all changes and modification coming within the scope of the invention as defined in the appended claims.

Having thus described our invention, what we claim as new, and desire to secure by Letters Patent is:

1. In a method of operation of a magnetic resonance spectrometer employing a Zeeman field and at least one orthogonal radio frequency (rf) field for energization of the material, the improvement comprising:

varying the Zeeman field to produce a sinusoidal off-resonance component of the Zeeman field of amplitude $$\beta \frac{\omega_a}{\gamma} / \sqrt{3}$$

and of frequency $\omega_a$;

where $\omega_a$ is a constant which is large with respect to the width of an NMR line of the material and $\beta$ is a constant;

applying a first rf field normal to said off-resonance component of the Zeeman field and modulating the amplitude of said rf field to produce a sinusoidal envelope of amplitude $$\frac{\sqrt{2}}{\sqrt{3}} \beta \frac{\omega_a}{\gamma}$$

and of frequency $\omega_a$;

selecting $\beta$ such that $J_0(2\beta) = -2J_0(\beta) \simeq 0$;

by eliminating said first rf field for about 2 to 5 microseconds at or about the zero crossing of said sinusoidal envelope once per audio cycle to introduce discontinuities therein; and employing said discontinuities for observation windows for the NMR signals.

2. The method of claim 1 further comprising:

applying a second rf field orthogonal to said off-resonance component of said Zeeman field and to said first modulated rf field, having an envelope with frequency $\omega_a$, and amplitude $$\frac{\sqrt{2}}{\sqrt{3}} \beta \frac{\omega_a}{\gamma},$$

wherein said first rf field and said second rf field are applied alternately; and selecting $\beta$ such that $J_0(2\beta) = 0$.

3. The method of claim 1 further comprising:

imposing a DC component of the off-resonance component of the Zeeman field; and imposing an additional amplitude modulation component for said first rf field which is the analog to the DC component of the Zeeman field; and adjusting $\beta$ such that $J_0(\beta) = J_1(2\beta) \simeq 0$.

4. The method of claim 3, wherein said DC component and additional amplitude modulation DC analog reverse in sign with each period, and $\beta$ is adjusted such that $J_1(2\beta) = 0$.

5. The method of claim 1, 2, 3, or 4 wherein said modulation of the Zeeman field is virtual and is induced by imposing a frequency modulation of the form $$\omega_{rf}(t) = \omega_0 + 1/\sqrt{3} \, \beta \, \omega_a \cos \omega_a t$$

on said rf fields, having a period $1/\omega_a$ where $\omega_0$ is a constant.

6. A method of operation of a magnetic resonance spectrometer comprising:

amplitude modulating an envelope of a first rf field and adjusting the amplitude of said envelope of said modulation to produce a sinusoidal envelope of amplitude $$\frac{\sqrt{2}}{\sqrt{3}} \beta \frac{\omega_a}{\gamma}$$

and of frequency $\omega_a$;

amplitude modulating an envelope of a second rf field which is normal to said first rf field direction and adjusting said modulation to produce a sinusoidal envelope of amplitude $$\frac{\sqrt{2}}{\sqrt{3}} \beta \frac{\omega_a}{\gamma}$$

and of frequency $\omega_a$;

selecting $\beta$ such that $J_1(2\beta) = -1/6$;

applying said first rf field and said second rf field for alternating periods of times each of said periods of time being $1/\omega_a$ long;

eliminating said first rf field and said second rf field every second audio cycle for about 2 to 5 microseconds at or about the zero crossing of these sinusoidal envelopes to introduce discontinuities into said rf fields; and employing said discontinuities for observation windows for the NMR signals.

* * * * *